(12) United States Patent
Koyama et al.

(10) Patent No.: US 9,084,373 B2
(45) Date of Patent: Jul. 14, 2015

(54) THERMALLY CONDUCTIVE ADHESIVE

(75) Inventors: Taichi Koyama, Tochigi (JP); Takayuki Saito, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 114 days.

(21) Appl. No.: 13/978,600

(22) PCT Filed: Dec. 15, 2011

(86) PCT No.: PCT/JP2011/078988
§ 371 (c)(1),
(2), (4) Date: Jul. 8, 2013

(87) PCT Pub. No.: WO2012/114613
PCT Pub. Date: Aug. 30, 2012

(65) Prior Publication Data
US 2013/0279118 A1  Oct. 24, 2013

(30) Foreign Application Priority Data

Feb. 24, 2011  (JP) ................................ 2011-037904

(51) Int. Cl.
| | |
|---|---|
| *H05K 7/20* | (2006.01) |
| *C09J 9/00* | (2006.01) |
| *H01L 23/373* | (2006.01) |
| *C09J 11/04* | (2006.01) |
| *H01L 23/00* | (2006.01) |
| *C08K 3/08* | (2006.01) |

(52) U.S. Cl.
CPC ................ *H05K 7/2039* (2013.01); *C09J 9/00* (2013.01); *C09J 11/04* (2013.01); *H01L 23/3737* (2013.01); *H01L 24/29* (2013.01); *C08K 3/08* (2013.01); *C08K 2003/0806* (2013.01);

(Continued)

(58) Field of Classification Search
CPC ..... H05K 7/2039; H01L 23/3737; C09J 9/02; C09J 11/04
USPC ....................... 361/709; 252/74, 76
See application file for complete search history.

(56) References Cited

U.S. PATENT DOCUMENTS

2005/0056365 A1* 3/2005 Chan .......................... 156/307.7
2009/0114885 A1  5/2009 Yamaguchi
(Continued)

FOREIGN PATENT DOCUMENTS

CN   101426875 A   5/2009
JP   A-2004-10828   1/2004
(Continued)

OTHER PUBLICATIONS

Mar. 13, 2012 International Search Report issued in International Patent Application No. PCT/JP2011/078988.
Aug. 17, 2012 International Preliminary Report on Patentability issued in International Application No. PCT/JP2011/078988 (with translation).
Jan. 13, 2015 Office Action issued in Japanese Patent Application No. 2011-273977.
Feb. 4, 2015 Office Action issued in Chinese Application No. 201180068377.5.

*Primary Examiner* — Andrew Coughlin
(74) *Attorney, Agent, or Firm* — Oliff PLC

(57) ABSTRACT

A thermally conductive adhesive having: a thermosetting adhesive containing a curable component and a curing agent for the curable component, and a metal filler dispersed in the thermosetting adhesive uses a silver powder and a solder powder as the metal filler. The solder powder to be used has a melting temperature lower than the thermal curing temperature of the thermally conductive adhesive and produces a high-melting-point solder alloy having a melting point higher than the melting temperature of the solder powder when the solder powder is reacted with the silver powder under thermal curing conditions of the thermally conductive adhesive. A curing agent having flux activity to the metal filler is used as the curing agent.

2 Claims, 3 Drawing Sheets

(52) U.S. Cl.
CPC ........... *H01L 2224/29298* (2013.01); *H01L 2224/48091* (2013.01); *H01L 2224/73265* (2013.01); *H01L 2924/01322* (2013.01); *H01L 2924/07811* (2013.01); *H01L 2924/12041* (2013.01)

(56) References Cited

U.S. PATENT DOCUMENTS

| | | |
|---|---|---|
| 2009/0155608 A1 | 6/2009 | Nomura |
| 2010/0059872 A1 | 3/2010 | Katsurayama |

FOREIGN PATENT DOCUMENTS

| | | |
|---|---|---|
| JP | A-2004-335872 | 11/2004 |
| JP | 2005-093996 A | 4/2005 |
| JP | A-2005-194306 | 7/2005 |
| JP | A-2006-143795 | 6/2006 |
| JP | A-2006-523760 | 10/2006 |
| WO | WO 2007/052661 A1 | 5/2007 |
| WO | WO 2008/023452 A1 | 2/2008 |
| WO | WO 2008/026517 A1 | 3/2008 |

\* cited by examiner

THERMALLY CONDUCTIVE ADHESIVE

TECHNICAL FIELD

The present invention relates to a thermally conductive adhesive including a metal filler dispersed in a thermosetting adhesive containing a curable component and a curing agent for the curable component.

BACKGROUND ART

In order to dissipate heat generated by an LED (light emitting diode) chip and an IC (integrated circuit) chip mounted on a heat-dissipating substrate into a heat sink via the heat-dissipating substrate, the heat-dissipating substrate and the heat sink have been adhered to each other with a thermally conductive adhesive. Such a thermally conductive adhesive has been proposed, in which a high-melting-point metal powder and a low-melting-point metal powder have been dispersed as a metal filler in a thermosetting adhesive containing dicarboxylic acid mono(meth)acryloyl alkyl ethyl ester as a curable component having flux activity, a glycidyl ether compound for inactivating the flux activity at high temperatures, a (meth)acrylic monomer as a diluent to be a curable component, and a radical polymerization initiator (Patent Literature 1). The heat conduction of this thermally conductive adhesive has been realized by a sintered structure obtained by sintering liquefied low-melting-point metal and high-melting-point metal in the thermosetting adhesive before the adhesive is solidified.

CITATION LIST

Patent Literature

Patent Literature 1: Japanese Patent Application Laid-Open No. 2006-523760

SUMMARY OF INVENTION

Technical Problem

However, the thermally conductive adhesive described in Patent Literature 1 has been solidified by radical polymerization with a fast reaction rate, which may cause solidification of the thermally conductive adhesive before the low-melting-point metal is liquefied to sufficiently bind particles of the high-melting-point metal powder to each other. Accordingly, in order to ensure intended thermal conductivity, a metal filler has been blended such that the filling rate of the metal filler, as defined by the following formula (1), exceeds 90% (Example). This has relatively decreased the contained amount of the thermosetting adhesive to cause another problem of reduced adhesion force thereof.

Filling Rate of Metal Filler(%)={Metal Filler/(Metal Filler+Curable Component+Curing Agent)}×100  (1)

The present invention addresses to solve the above-mentioned problems of the conventional techniques. Accordingly, it is an object of the present invention to provide a thermally conductive adhesive including: a thermosetting adhesive containing a curable component and a curing agent for the curable component; and a metal filler dispersed in the thermosetting adhesive, in which low-melting-point metal can be liquefied to sufficiently bind particles of the high-melting-point metal powder to each other before solidification of the thermally conductive adhesive, and the adhesion force of the thermally conductive adhesive itself can be maintained at good level.

Solution to Problem

The present inventors have assumed that, when a thermally conductive adhesive containing a thermosetting adhesive and a metal filler is thermally cured, formation of a continuous network of metal filler (continuous phase of metal) in the thermally-cured product can realize good thermal conductivity with relatively small amount of the metal filler as compared with conventional thermally conductive adhesives and, in addition, can increase the content ratio of the thermosetting adhesive as compared with conventional thermally conductive adhesives, whereby reduced adhesion force of the thermally conductive adhesive can be necessarily suppressed. Under such assumption, in addition to a silver powder, a low-melting-point solder powder is used in combination as the metal filler, in which the low-melting-point solder powder has a melting temperature lower than the thermal curing temperature of the thermally conductive adhesive and produces a high-melting-point solder alloy having a melting point higher than the melting temperature of the solder powder when the solder powder is reacted with the silver powder under thermal curing conditions of the thermally conductive adhesive. Moreover, a curing agent having flux activity is used as the curing agent. As a result, the present inventors have found that the use of such meal fillers and the curing agent can form the continuous network of molten solder (continuous phase of metal) via the silver powder. The present inventors have completed the present invention based on these findings.

Accordingly, the present invention provides a thermally conductive adhesive including a metal filler dispersed in a thermosetting adhesive containing a curable component and a curing agent for the curable component, wherein the metal filler has a silver powder and a solder powder, the solder powder has a melting temperature lower than the thermal curing temperature of the thermally conductive adhesive and produces a high-melting-point solder alloy having a melting point higher than the melting temperature of the solder powder when the solder powder is reacted with the silver powder under thermal curing conditions of the thermally conductive adhesive, and the curing agent has flux activity to the metal filler.

The present invention also provides: a power LED module in which an LED chip is mounted on a surface of a heat-dissipating substrate with the thermally conductive adhesive of the present invention by die bonding, a surface electrode of the LED chip and a surface electrode of the heat-dissipating substrate are connected by wire-bonding, and the heat-dissipating substrate is adhered to a heat sink with the thermally conductive adhesive of the present invention; a power LED module in which an LED chip is flip-chip mounted on a surface of a heat-dissipating substrate and the heat-dissipating substrate is adhered to a heat sink with the thermally conductive adhesive of the present invention; and a power IC module in which an IC chip is mounted on a surface of a heat-dissipating substrate with the thermally conductive adhesive of the present invention by die bonding, a surface electrode of the IC chip and a surface electrode of the heat-dissipating substrate are connected by wire-bonding, and the heat-dissipating substrate is adhered to a heat sink with the thermally conductive adhesive of the present invention.

Advantageous Effects of Invention

In the thermally conductive adhesive of the present invention, in addition to the silver powder, the solder powder is used in combination as the metal filler, in which the solder powder has a melting temperature lower than the thermal curing temperature of the thermally conductive adhesive and produces a high-melting-point solder alloy having a melting point higher than the melting temperature of the solder powder when the solder powder is reacted with the silver powder under thermal curing conditions of the thermally conductive adhesive. For this reason, when the thermally conductive adhesive is thermally cured, the solder powder melts before the temperature reaches the thermal curing temperature. In addition, since the curing agent having flux activity is used, the wettability of the molten solder to the silver powder can be improved. Accordingly, the continuous network (continuous phase of metal) can be formed via the silver powder with relatively small amount of the molten metal filler in the thermally-cured product of the thermally conductive adhesive, thereby realizing heat conduction at high efficiency. Therefore, the contained amount of the thermosetting adhesive can be relatively increased to improve the adhesion force of the cured product of the thermally conductive adhesive.

The molten solder powder produces the high-melting-point solder alloy having a melting point higher than the melting temperature of the solder powder when the solder powder is reacted with the silver powder under thermal curing conditions of the thermally conductive adhesive. Accordingly, the heat resistance of the cured product of the thermally conductive adhesive can be improved.

In addition, since the curing agent itself is incorporated as one of polymerization units into the cured product together with the curable component, blooming of the curing agent does not occur. Thus, the reduced adhesion force of the thermally conductive adhesive due to such blooming can be prevented.

DESCRIPTION OF EMBODIMENTS

Figure 1:
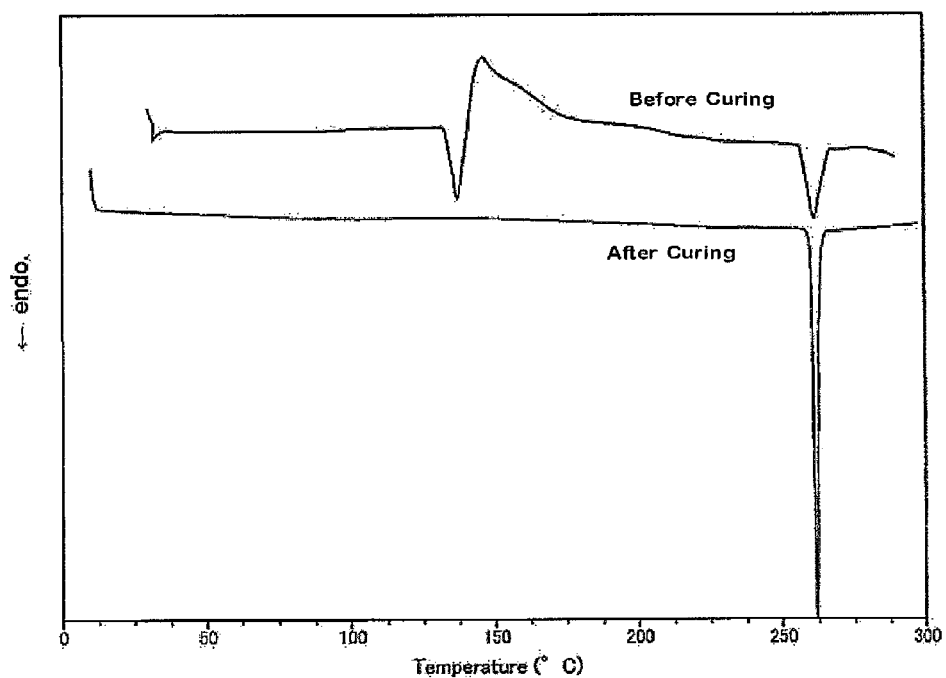
FIG. 1 is a chart of DSC (differential scanning calorimetry) before and after curing of a thermally conductive adhesive of Example 1.

The thermally conductive adhesive of the present invention includes: a thermosetting adhesive containing a curable component and a curing agent for the curable component; and a metal filler dispersed in the thermosetting adhesive. In this case, the metal filler contains a silver powder and a solder powder. The thermosetting adhesive is first described and the metal filler is next described.

<Thermosetting Adhesive>

As the curable component constituting the thermosetting adhesive, an epoxy resin, a phenol resin, a urethane resin, and others, which are allowed to have adhesion by thermal curing with the curing agent, can be used. In particular, an epoxy resin is preferably used in order to inactivate the flux component. Examples of such an epoxy resin may include glycidyl ether-based epoxy resins such as a bisphenol A-based epoxy resin, a bisphenol F-based epoxy resin, and a novolac-based epoxy resin. In addition to these, generally known ones such as a cycloaliphatic epoxy resin and a hetero ring-containing epoxy resin can be applied. In the case of a cycloaliphatic epoxy resin with a relatively fast reaction rate, the use thereof accelerates the cure rate of the thermally conductive adhesive and thus it is preferable that the network of the molten solder powder (continuous phase of metal) be formed more rapidly. In that case, the solder powder with a lower melting point may be used.

As the curing agent, a curing agent which corresponds to the curable component and has flux activity is used. When the curable component is an epoxy resin, it is preferable to use an acid anhydride as the curing agent because any gas does not generate during thermal curing, a long pot life can be realized by mixing it with the epoxy resin, and a good balance between electrical properties, chemical properties, and mechanical properties of the resulting cured product can be realized.

Examples of a procedure for allowing the curing agent to exhibit flux activity include introduction of proton acid groups, such as a carboxyl group, a sulfonyl group, and a phosphate group, into the curing agent by well-known methods. In particular, a carboxyl group is preferably applied in terms of the reactivity with an epoxy resin.

Accordingly, examples of the preferred curing agent when the curable component is an epoxy resin can include a monoacid anhydride of tricarboxylic acid, preferably cyclohexane-1,2,4-tricarboxylic acid-1,2-acid anhydride, in which free carboxyl groups are present.

The content ratio of the curable component to the curing agent in the thermosetting adhesive depends on the kind of the curable component or the curing agent. When the curable component is an epoxy resin and the curing agent is a monoacid anhydride of tricarboxylic acid, relatively too high contained amount or too low contained amount of the epoxy resin may result in insufficient curing. Accordingly, the equivalent ratio ([epoxy resin]/[curing agent]) is preferably 1:0.5 to 1:1.5, more preferably 1:0.8 to 1:1.2 on a molar equivalent basis.

In addition to the curable component and the curing agent as described above, various kinds of additives blended in well-known thermally conductive adhesives, for example, a pigment, an ultraviolet absorber, a curing accelerator, and a silane coupling agent can be added to the thermosetting adhesive without impairing the effects of the invention.

The thermosetting adhesive for constituting the thermally conductive adhesive can be prepared by uniformly mixing the curable component, the curing agent, and other additives with conventional methods.

<Metal Filler>

The metal filler which is dispersed in the above-described thermosetting adhesive to prepare the thermally conductive adhesive contains the silver powder and the solder powder.

The silver powder has high thermal conductivity but a high melting point, and thus does not melt by heating during general thermal curing of the thermally conductive adhesive. Accordingly, in order to realize efficient thermal conduction using only the silver powder as the metal filler, the particles of the silver powder which is not molten need to be brought into contact with each other. In order to do so, a large amount of the silver powder may be blended in the thermally conductive adhesive, but a large amount of the silver powder blended may relatively decrease the contained amount of the thermosetting adhesive to reduce the adhesion force. In the present invention, the solder powder having a melting temperature close to the thermal curing temperature is used as part of the total amount of the metal filler blended in the thermally conductive adhesive, whereby the network between the particles of the silver powder is formed with the molten solder powder (making continuous phase of metal).

The solder powder used for such a purpose specifically has a melting temperature lower than the thermal curing temperature of the thermally conductive adhesive and produces a high-melting-point solder alloy having a melting point higher than the melting temperature of the solder powder when the solder powder is reacted with the silver powder under thermal curing conditions of the thermally conductive adhesive. Thus, the heat resistance of the cured product of the thermally conductive adhesive can be improved.

Examples of such a solder powder may preferably include a Sn—Bi-based solder powder, a Sn—In-based solder powder, and a Sn—Zn-based solder powder, and in particular, may preferably include a Sn—Bi-based solder powder and a Sn—In-based solder powder in view of low-temperature meltability. Specific examples of the Sn—Bi-based solder powder may include a Sn-58Bi eutectic solder powder (melting point of 139° C.), specific examples of the Sn—In-based solder powder may include a Sn-52In eutectic solder powder (melting point of 117° C.), and specific examples of the Sn—Zn-based solder powder may include a Sn-9Zn eutectic solder powder (melting point of 199° C.).

Examples of the particle shape of the silver powder and the solder powder may include a spherical shape, a flat shape, a grain shape, and a needle shape.

As to the mass ratio of the silver powder to the solder powder, too much silver powder tends to reduce the network (continuous phase of metal), and too little silver powder tends to reduce the amount of the high-melting-point solder produced. Therefore, the mass ratio is preferably 1:2 to 2:1, and more preferably 1:1.5 to 1.5:1.

<Thermally Conductive Adhesive>

The thermally conductive adhesive of the present invention can be prepared by uniformly mixing the metal filler and the thermosetting adhesive which are described above with conventional methods, and an organic solvent may be added if necessary. In this case, when the contained amount of the metal filler in the thermally conductive adhesive (i.e., the filling rate of the metal filler on a mass basis as defined by the following formula (1)) is too low, the network (continuous phase of metal) tends to be hardly formed. When it is too high, the adhesion force of the thermally conductive adhesive tends to be reduced. Therefore, the contained amount of the metal filler in the thermally conductive adhesive is preferably 75% to 95%, and more preferably 80% to 90%.

$$\text{Filling Rate of Metal Filler}(\%) = \{\text{Metal Filler}/(\text{Metal Filler} + \text{Curable Component} + \text{Curing Agent})\} \times 100 \quad (1)$$

The thermally conductive adhesive of the present invention can be preferably applied when a heat-dissipating substrate having an LED chip and an IC chip mounted thereon is adhered to a heat sink to constitute a power LED module and a power IC module. The power LED module includes a module for wire-bonding mounting (FIG. 3) and a module for flip-chip mounting (FIG. 4), and the power IC module includes a module for wire-bonding mounting (FIG. 5).

Figure 3:
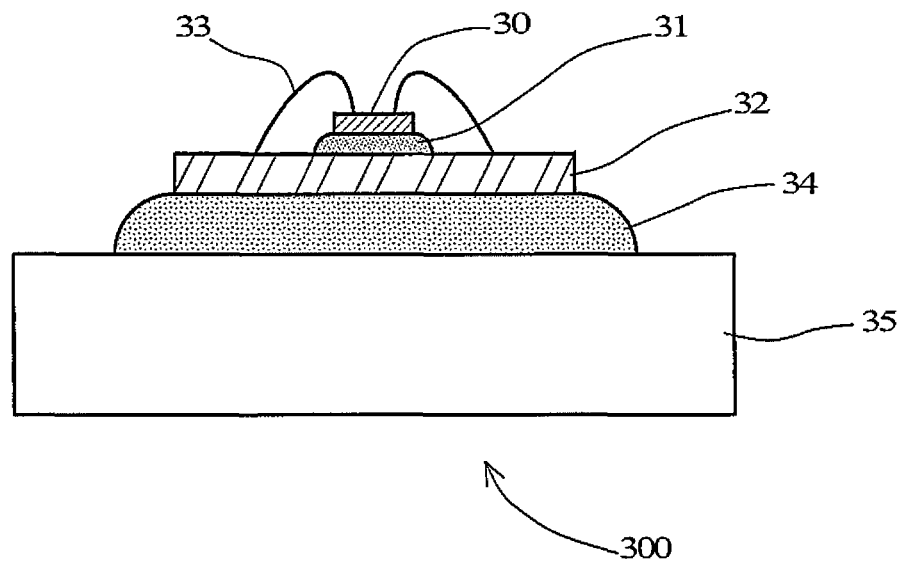
FIG. 3 is a schematic cross-sectional view of a power LED module for wire-bonding mounting according to the present invention.

A power LED module 300 for wire-bonding mounting in FIG. 3 has a structure in which an LED chip 30 is mounted on a heat-dissipating substrate 32 with a thermally conductive adhesive 31 of the present invention by die bonding, a surface electrode (not shown) of the LED chip 30 and a surface electrode (not shown) of the heat-dissipating substrate 32 are connected by wire-bonding (specifically, connected by bonding wire 33), and the heat-dissipating substrate 32 is further adhered to a heat sink 35 with a thermally conductive adhesive 34 of the present invention. In the power LED module 300, the heat generated by the LED chip 30 is sequentially transmitted to the cured product of the thermally conductive adhesive 31, the heat-dissipating substrate 32, the cured product of the thermally conductive adhesive 34, and the heat sink 35 to prevent decrease in performance of the LED chip 30 due to the heat.

Figure 4:
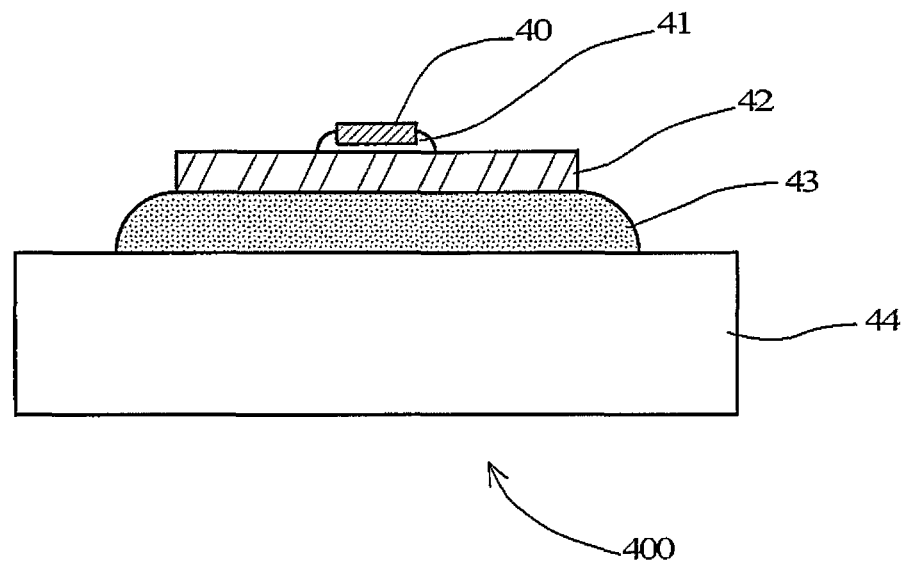
FIG. 4 is a schematic cross-sectional view of a power LED module for flip-chip mounting according to the present invention.

A power LED module 400 for flip-chip mounting in FIG. 4 has a structure in which an LED chip 40 is flip-chip mounted on a heat-dissipating substrate 42 with an adhesive 41 such as well-known thermosetting anisotropic conductive adhesives, and the heat-dissipating substrate 42 is further adhered to a heat sink 44 with a thermally conductive adhesive 43 of the present invention. In the power LED module 400, the heat generated by the LED chip 40 is sequentially transmitted to the adhesive 41, the heat-dissipating substrate 42, the effective product of the thermally conductive adhesive 43, and the heat sink 44 to prevent decrease in performance of the LED chip 40 due to the heat.

Figure 5:
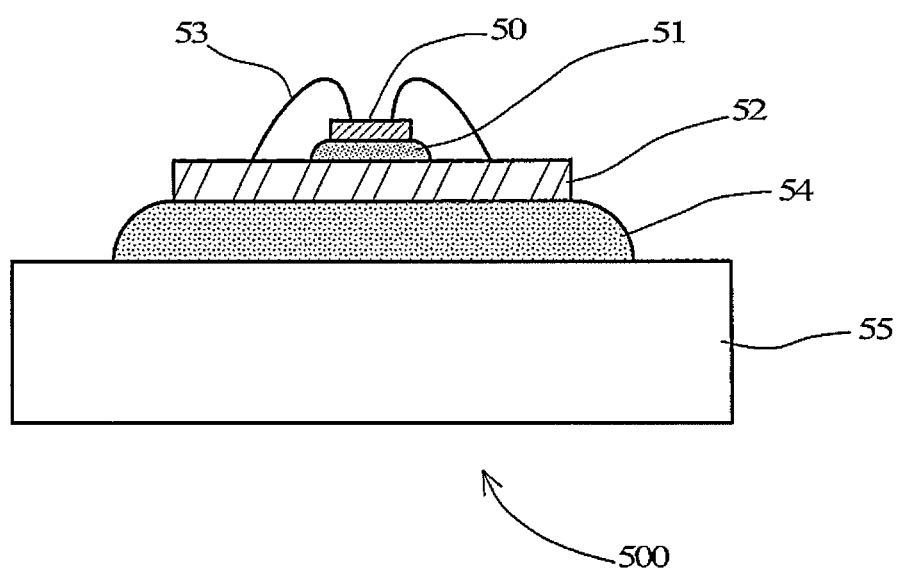
FIG. 5 is a schematic cross-sectional view of a power IC module for wire-bonding mounting according to the present invention.

A power IC module 500 for wire-bonding mounting in FIG. 5 has a structure in which an IC chip 50 is mounted on the surface of a heat-dissipating substrate 52 with a thermally conductive adhesive 51 of the present invention by die bonding, a surface electrode (not shown) of the IC chip 50 and a surface electrode (not shown) of the heat-dissipating substrate 52 are connected by wire-bonding (specifically, connected by a bonding wire 53), and the heat-dissipating substrate 52 is adhered to a heat sink 55 with a thermally conductive adhesive 54 of the present invention. In the power IC module 500, the heat generated by the IC chip 50 is sequentially transmitted to the thermally conductive adhesive 51, the heat-dissipating substrate 52, the thermally conductive adhesive 54, and the heat sink 55 to prevent decrease in performance of the IC chip 50 due to the heat.

In the power LED modules (300, 400) or the power IC module (500) in FIGS. 3 to 5, in order to improve heat dissipation efficiency, heat diffusion plates can be held between the heat-dissipating substrates (32, 42, 52) and the heat sinks (35, 44, 55) using the thermally conductive adhesive of the present invention, respectively.

In the modules in FIGS. 3 to 5, the configuration except for use of the thermally conductive adhesive of the present invention can be the same as that of a well-known power LED module or power IC module.

EXAMPLES

Example 1

100 parts by mass of a bisphenol F-based epoxy resin (jER806, Mitsubishi Chemical Corporation) as a curable component, 70 parts by mass of cyclohexane-1,2,4-tricarboxylic acid-1,2-acid anhydride (H-TMAn/H-TMAn-S, Mitsubishi Gas Chemical Company, Inc.) as a curing agent, and 340 parts by mass of a Sn-58Bi solder powder having an average particle diameter of 20 μm (Sn—Bi, Mitsui Mining & Smelting Co., Ltd.) and 340 parts by mass of a silver powder (AgC-224, Fukuda Metal Foil & Powder Co., Ltd.) as metal fillers were uniformly mixed using a mixer (Thinky Mixer, automatic revolution mixer, Thinky Corporation) to obtain a paste thermally conductive adhesive of Example 1. The filling rate of the metal filler was 80%. The equivalent ratio of the epoxy resin being the curable component to the cyclohexane-1,2,4-tricarboxylic acid-1,2-acid anhydride being the curing agent ([epoxy resin]/[curing agent]) on a molar equivalent basis was shown in Table 1.

The obtained thermally conductive adhesive before thermal curing and the cured product of the thermally conductive adhesive after thermal curing (heating at 150° C. for 60 minutes) were subjected to differential scanning calorimetry (measurement device: DSC Q100, TA Instruments, temperature rising rate of 10° C./minute, scanning temperature range of 10° C. to 300° C.). The obtained result (DSC chart) is shown in FIG. 1. The cured product of the thermally conductive adhesive was subjected to cross-section polishing, and the cross-section thereof was photographed with a scanning electron microscope (S-3000N, Hitachi, Ltd.). The obtained electron microscope photograph is shown in FIG. 2.

In the DSC curve before curing in FIG. 1, the heat absorption associated with melting of Sn-58Bi solder was observed at about 140° C., the heat generation of the thermosetting adhesive was observed near 150° C. to 160° C., and the heat absorption associated with melting of Sn-3.5Ag was observed near 260° C. In the DSC curve after curing, neither the heat absorption at melting of Sn—Bi solder near 140° C. nor the heat generation at curing of the thermally conductive adhesive near 150° C. to 160° C. was observed, but large heat absorption associated with melting of Sn-3.5Ag was observed near 260° C.

Figure 2:
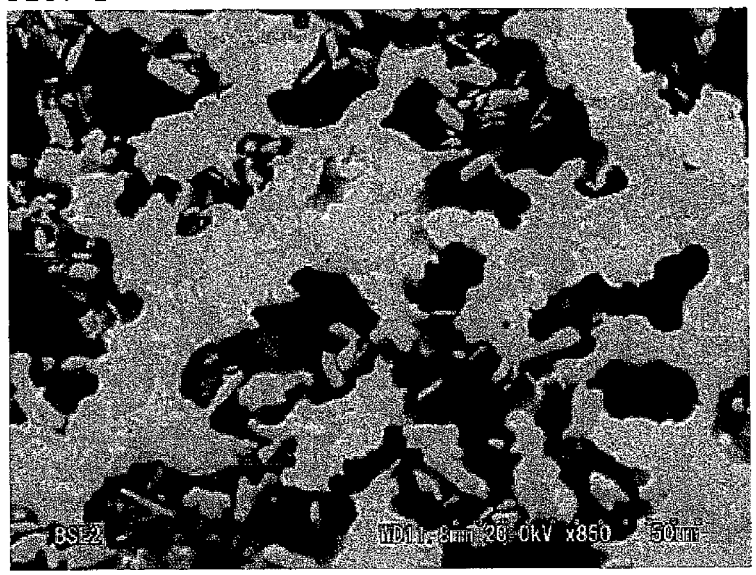
FIG. 2 is a photograph of a cross section of the cured thermally conductive adhesive of Example 1.

In the electron microscope photograph of FIG. 2, three different brightness regions, black, gray, and highlight, were observed. The highlight corresponds to Bi and the gray region corresponds to the high-melting-point solder alloy and the silver powder. The black region corresponds to the cured product of the thermosetting adhesive. It was thus observed that the network (continuous phase of metal) was formed in the highlight and gray regions. The high-melting-point solder alloy to be newly generated by thermal curing is supposed to be included in the gray region in the photograph.

The obtained thermally conductive adhesive was tested to evaluate "low-temperature curability," "formation of the network (continuous phase of metal)," "thermal conductivity," and "adhesive strength" as follows, and the obtained results are shown in Table 1.

<Low-Temperature Curability>

The case where both the melting temperature of the solder powder and the curing starting temperature of the thermally conductive adhesive were 200° C. or less and the melting temperature was lower than the curing starting temperature was evaluated as "AA." The case where both the melting temperature of the solder powder and the curing starting temperature of the thermally conductive adhesive were 200° C. or less but the melting temperature was not lower than the curing starting temperature was evaluated as "A." The other cases were evaluated as "C."

<Formation of Network>

The cured product of the thermally conductive adhesive was cut and the cross-section thereof was polished. The polished surface was photographed with the scanning electron microscope (S-3000N, Hitachi, Ltd.) to observe whether the network formed by the solder powder (continuous phase of metal) was present.

<Thermal Conductivity>

The cured product of the thermally conductive adhesive was measured for thermal conductivity using a thermal conductivity tester (LFA447 NanoFlash, produced by Netzsch). In the obtained test results, the case where the thermal conductivity was 8.0 W/mk or more was evaluated as "AA," the case of 5.0 W/mk or more and less than 8.0 W/mk as "A," and the case of less than 5.0 W/mk as "C."

<Adhesive Strength>

The thermally conductive adhesive was applied between two aluminum plates (A5052P), 100 mm×15 mm×0.5 mm, such that the size of the thermally conductive adhesive was 10 mm in diameter (contact area between two aluminum plates: 15 mm×15 mm), and the thermally conductive adhesive was then cured in an oven at 150° C. for 60 minutes to prepare a measurement sample. The shear strength thereof was measured using a tensile testing machine (Tensilon, Orientec Co., Ltd.) (25° C., tension rate of 5 mm/min). In the obtained test results, the case where the adhesive strength was 130 kN/cm$^2$ or more was evaluated as "AA," the case of 100 kN/cm$^2$ or more and less than 130 kN/cm$^2$ as "A," and the case of less than 100 kN/cm$^2$ as "C."

Examples 2 to 7, Comparative Examples 1 to 4

The same procedure as in Example 1 was repeated using the components shown in Table 1 to obtain paste thermally conductive adhesives of Examples 2 to 7 and Comparative Examples 1 to 4. As in Example 1, the obtained thermally conductive adhesives were tested to evaluate "low-temperature curability," "formation of the network (continuous phase of metal)," "thermal conductivity," and "adhesive strength," and the obtained results are shown in Table 1.

TABLE 1

| Blended Components | | Example | | | | | | | Comparative Example | | | |
|---|---|---|---|---|---|---|---|---|---|---|---|---|
| | | 1 | 2 | 3 | 4 | 5 | 6 | 7 | 1 | 2 | 3 | 4 |
| Epoxy Resin | Bisphenol F-based Epoxy Resin *1 | 100 | 100 | 100 | 100 | 100 | 100 | 100 | 100 | 100 | 100 | 100 |
| Curing Agent | Acid Anhydride with Flux Activity *2 | 70 | 70 | 70 | 70 | 70 | 70 | 95 | — | — | 70 | 70 |
| | Acid Anhydride without Flux Activity *3 | — | — | — | — | — | — | — | 65 | 65 | — | — |
| [Epoxy Resin]/[Curing Agent] (Equivalent Ratio) | | 0.86 | 0.86 | 0.86 | 0.86 | 0.86 | 0.86 | 1.16 | 0.6 | 0.6 | 0.86 | 0.86 |
| Curing Accelerator | DBU-based Tetraphenylborate *4 | — | — | — | — | — | — | — | 5 | 5 | — | — |
| Metal Filler | Sn—Bi Solder Powder *5 | 340 | 480 | 230 | 480 | — | — | 390 | 340 | 480 | 680 | — |
| | Sn—In Solder Powder *6 | — | — | — | — | 340 | — | — | — | — | — | — |
| | Sn—Zn Solder Powder *7 | — | — | — | — | — | 340 | — | — | — | — | — |
| | Ag Powder *8 | 340 | 480 | 450 | 230 | 340 | 340 | 390 | 340 | 480 | — | 680 |
| Filling Rate of Metal Filler (%) | | 80 | 85 | 80 | 80 | 80 | 80 | 80 | 80 | 85 | 80 | 80 |
| Evaluation | Low-Temperature Curability | AA | AA | AA | AA | AA | A | AA | AA | AA | AA | — |
| | Formation of Network | Yes | Yes | Yes | Yes | Yes | Yes | Yes | No | No | No | No |

TABLE 1-continued

|  | Example | | | | | | | Comparative Example | | | |
| --- | --- | --- | --- | --- | --- | --- | --- | --- | --- | --- | --- |
| Blended Components | 1 | 2 | 3 | 4 | 5 | 6 | 7 | 1 | 2 | 3 | 4 |
| Thermal Conductivity | AA | AA | A | A | AA | A | AA | B | A | B | B |
| Adhesive Strength | AA | A | AA | AA | AA | AA | AA | A | B | AA | AA |

*1 jER806, Mitsubishi Chemical Corporation
*2 H-TMAn/H-TMAn-S, Mitsubishi Gas Chemical Company, Inc.
*3 HNA-100, New Japan Chemical Co., Ltd.
*4 U-CAT 5002, San-Apro Ltd.
*5 Mitsui Mining & Smelting Co., Ltd.
*6 Senju Metal Industry Co., Ltd.
*7 Mitsui Mining & Smelting Co., Ltd.
*8 AgC-224, Fukuda Metal Foil & Powder Co., Ltd.

Table 1 shows that the thermally conductive adhesives of Examples 1 to 7 having the molar equivalent ratio of the epoxy resin to the curing agent in the range of 1:0.8 to 1:1.2 provide good results for any evaluation items of the low-temperature curability, the formation of the network (continuous phase of metal), the thermal conductivity, and the adhesive strength.

On the other hand, in Comparative Example 1, the acid anhydride without flux activity was used as a curing agent, and thus the molten product of the solder powder did not sufficiently wet to the silver powder so that the network (continuous phase of metal) was not formed and the thermal conductivity was evaluated as low. In Comparative Example 2, the acid anhydride without flux activity was used as a curing agent, and thus the molten product of the solder powder did not sufficiently wet to the silver powder so that the network (continuous phase of metal) was not formed. However, the filling rate of the metal filler was increased and thus the thermal conductivity was evaluated as preferable, while the amount of the thermosetting adhesive was relatively decreased and thus the adhesive strength was reduced. In Comparative Example 3, the silver powder which served as a core when the molten solder powder formed the network was not used so that the network (continuous phase of metal) was not formed and the thermal conductivity was evaluated as low. In Comparative Example 4, the solder powder which formed the network (continuous phase of metal) was not used so that the network (continuous phase of metal) was not formed and the thermal conductivity was evaluated as low.

Industrial Applicability

The thermally conductive adhesive of the present invention can form the continuous network (continuous phase of metal) via the silver powder with relatively small amount of the molten metal filler in the thermally-cured product of the thermally conductive adhesive, thereby realizing heat conduction at high efficiency. Thus, the contained amount of the thermosetting adhesive can be relatively increased to improve the adhesion force of the cured product of the thermally conductive adhesive. The molten solder powder produces the high-melting-point solder alloy having a melting point higher than the melting temperature of the solder powder when the solder powder is further reacted with the silver powder under thermal curing conditions of the thermally conductive adhesive. Accordingly, the heat resistance of the cured product of the thermally conductive adhesive can be improved. Therefore, the thermally conductive adhesive of the present invention is useful for adhesion of the heat sink in the power LED module or the power IC module.

REFERENCE SIGNS LIST 30, 40 LED chip
31, 34, 43, 51, 54 thermally conductive adhesive
32, 42, 52 heat-dissipating substrate
33, 53 bonding wire
35, 44, 55 heat sink
41 adhesive
50 IC chip
300 power LED module for wire-bonding mounting
400 power LED module for flip-chip mounting
500 power LED module for wire-bonding mounting

The invention claimed is:

1. A thermally conductive adhesive comprising a thermosetting adhesive containing a curable component and a curing agent for the curable component, and a metal filler dispersed in the thermosetting adhesive, wherein
the metal filler has a silver powder and a solder powder,
the solder powder has a melting temperature lower than a thermal curing temperature of the thermally conductive adhesive and produces a high-melting-point solder alloy having a melting point higher than the melting temperature of the solder powder when the solder powder is reacted with the silver powder under thermal curing conditions of the thermally conductive adhesive,
the curing agent has flux activity to the metal filler, and
the curable component is a glycidyl ether-based epoxy resin, and the curing agent is a monoacid anhydride of tricarboxylic acid.

2. The thermally conductive adhesive according to claim 1, wherein an equivalent ratio of the curable component and the curing agent ([epoxy resin]/[curing agent]) is 1:0.5 to 1:1.5 on a molar equivalent basis.

* * * * *